United States Patent [19]

Goutzoulis

[11] Patent Number: 4,714,826

[45] Date of Patent: Dec. 22, 1987

[54] APPARATUS AND METHOD FOR TESTING OUTPUTS OF LOGIC CIRCUITS BY MODULATING OPTICAL SEQUALS

[75] Inventor: Anastasios P. Goutzoulis, Pittsburgh, Pa.

[73] Assignee: Westinghouse Electric Corp., Pittsburgh, Pa.

[21] Appl. No.: 897,673

[22] Filed: Aug. 18, 1986

[51] Int. Cl.⁴ .......................................... G01R 19/14
[52] U.S. Cl. ............................... 250/213 A; 324/133
[58] Field of Search ................. 250/213 A; 324/73 R, 324/133; 364/822, 819

[56] References Cited

U.S. PATENT DOCUMENTS

| | | | |
|---|---|---|---|
| 3,944,921 | 3/1976 | Tsuda et al. | 324/133 |
| 4,218,142 | 8/1980 | Krugger et al. | 250/563 |
| 4,242,635 | 12/1980 | Burns | 324/158 |
| 4,408,884 | 10/1983 | Kleinknecht et al. | 356/355 |
| 4,523,143 | 6/1985 | Dvorak | 324/133 |
| 4,625,815 | 3/1987 | Collombet | 324/133 |

*Primary Examiner*—David C. Nelms
*Assistant Examiner*—Stephone B. Allen
*Attorney, Agent, or Firm*—R. P. Lenart

[57] ABSTRACT

Compressive, multiplicative electrical-optical system for testing high-speed, large scale logic devices. The output signals of the device are changed into optical signals which are applied to optical guided-wave light intensity modulators. Electrical reference signals of the desired, or correct, outputs are applied to the modulators to control the light passing through the modulators. The system provides a product of the actual output signal and the complement of the electrical reference signal, and a product of the complemented optical output signal and the uncomplemented electrical reference signal. The light output from the modulators during the formation of the two products is observed, with a detection of light from either product indicating that an error exists in an output channel of the device. Parallel, or simultaneous, product formation is provided in one embodiment, and sequential, or time spaced product formation, is provided in another embodiment. An acousto-optic implementation of the invention is also described.

23 Claims, 7 Drawing Figures

|     | DESIRED | ACTUAL | ERROR? |
|-----|---------|--------|--------|
| (A) | 0       | 0      | N      |
| (B) | 1       | 0      | Y      |
| (C) | 0       | 1      | Y      |
| (D) | 1       | 1      | N      |

FIG. 3

|     | COMPLEMENT OF DESIRED | ACTUAL | PRODUCT | RESULT |
|-----|-----------------------|--------|---------|--------|
| (A) | 1 | 0 | 0 | — |
| (B) | 0 | 0 | 0 | — |
| (C) | 1 | 1 | 1 | E |
| (D) | 0 | 1 | 0 | — |

FIG. 4

|     | DESIRED | COMPLEMENT OF ACTUAL | PRODUCT | RESULT |
|-----|---------|----------------------|---------|--------|
| (A) | 0 | 1 | 0 | — |
| (B) | 1 | 1 | 1 | E |
| (C) | 0 | 0 | 0 | — |
| (D) | 1 | 0 | 0 | — |

APPARATUS AND METHOD FOR TESTING OUTPUTS OF LOGIC CIRCUITS BY MODULATING OPTICAL SEQUALS

BACKGROUND OF THE INVENTION

This invention relates, in general, to high-speed digital testing systems and, more specifically, to optical testing of very large scale integrated circuit chips and boards.

With the increasing speed and number of input and output channels, or bits, of modern logic devices, the testing of such logic devices becomes a time consuming problem. With the advent of very large scale and high-speed integrated circuits, new testing procedures and systems are needed to improve the production testing of these components.

Optimum testing usually involves the operation of the device being tested at the normal speed of operation. The results of these tests can give information on the occurrence of any errors, the location of any errors that occur, and/or the type of error, that is, whether the error was a logic high or low. While all three error types may be important during early design and prototype production of the devices, later production of a confirmed and proven design may only require that the testing procedure indicate if any errors occur in the operation of the device.

Testing such devices usually involves the application of many signals to the input terminals, or pins, of the logic device and checking the output pins of the device to determine if the logic level on each pin is the desired value, usually by comparing it with reference values. Although this can be done by normal digital electronics, conventional circuits are usually too slow for the high-speed devices currently being produced. Therefore, the paralleling of several conventional electronic digital circuits is necessary to test all the bits of the high-speed device in a resonable time. However, even the paralleling of similar circuits which operate simultaneously in time presents problems due to the inability to suitably combine the outputs of these circuits into a single detection capability.

Therefore, it is desirable, and it is an object of this invention, to provide an improved testing system for high-speed, large scale logic devices having a plurality of input and output terminals. The system provided functions very quickly and is easily paralleled to permit simultaneous detection of several output channels of the device.

SUMMARY OF THE INVENTION

There is disclosed herein a new and useful system and method for testing high-speed, large scale logic devices for errors at their outputs. Electrical signals from the device being tested are applied to laser diodes which convert the electrical signals into light waves for application to optical guided-wave light intensity modulators. The modulators are controlled by electrical signals from a reference signal generator which provides data corresponding to the desired, or correct, logic values expected at the output of the logic device being tested. The outputs from the modulators are applied to light fibers which are bundled together and focused onto a light detecting diode. Whenever light passes through the modulators and is detected by the diode, an error condition is indicated.

In one emobidment of the invention, the optical complement of the logic output from the device under test is applied to the modulators, which are controlled by the uncomplemented electrical values of the expected, or correct, signal. Only when the optical signal is high, that is, producing light, and the reference signal is high, will the output fiber from the modulator contain light. This represents one of the two conditions which can cause error in the device under test. Another test, or product, is formed by applying an uncomplemented optical device output signal to the modulators which are controlled by a complemented electrical reference signal. Under these conditions, the modulators, which are connected to each channel of the device under test, will pass light only when the other error condition exists. Thus, either error condition will be signified by a passage of light through the modulators and detection by the diode.

A parallel arrangement of the invention includes separate laser diodes and modulators for forming each of the two products simultaneously in time. Another embodiment of the invention uses similar laser diodes and modulators, but changes the signals which are complemented at different intervals of time.

An acousto-optic implementation of the invention is disclosed wherein the reference signal and the actual output signal, one being suitably complemented, are applied to separate acousto-optic modulators located between a light source and a light detector. By alternating the data which is complemented, both products can be formed by the light passing through the two acousto-optic cells. A parallel implementation of the invention uses additional acousto-optic cells, or separate channels in two dimensional acousto-optic cells.

The invention disclosed herein uniquely uses the ability of light signals to be compressed and combined in a manner which permits the detection of light in any single channel instantly, thereby signifying the occurrence of an error in any channel of the device under test. A multiplicative algorithm is used to provide a valid test for all possible error conditions which may exist.

BRIEF DESCRIPTION OF THE DRAWINGS

Further advantages and uses of this invention will become more apparent when considered in view of the following detailed description and drawings, in which:

FIG. 2 is a table illustrating the logic error possibilities for a single device channel;

FIG. 3 is a table illllustrating one of the optical logic products formed by the system of this invention;

FIG. 4 is a table illustrating the other of the optical logic products formed by the system of this invention;

DESCRIPTION OF THE PREFERRED EMBODIMENTS

Figures 1, 5:
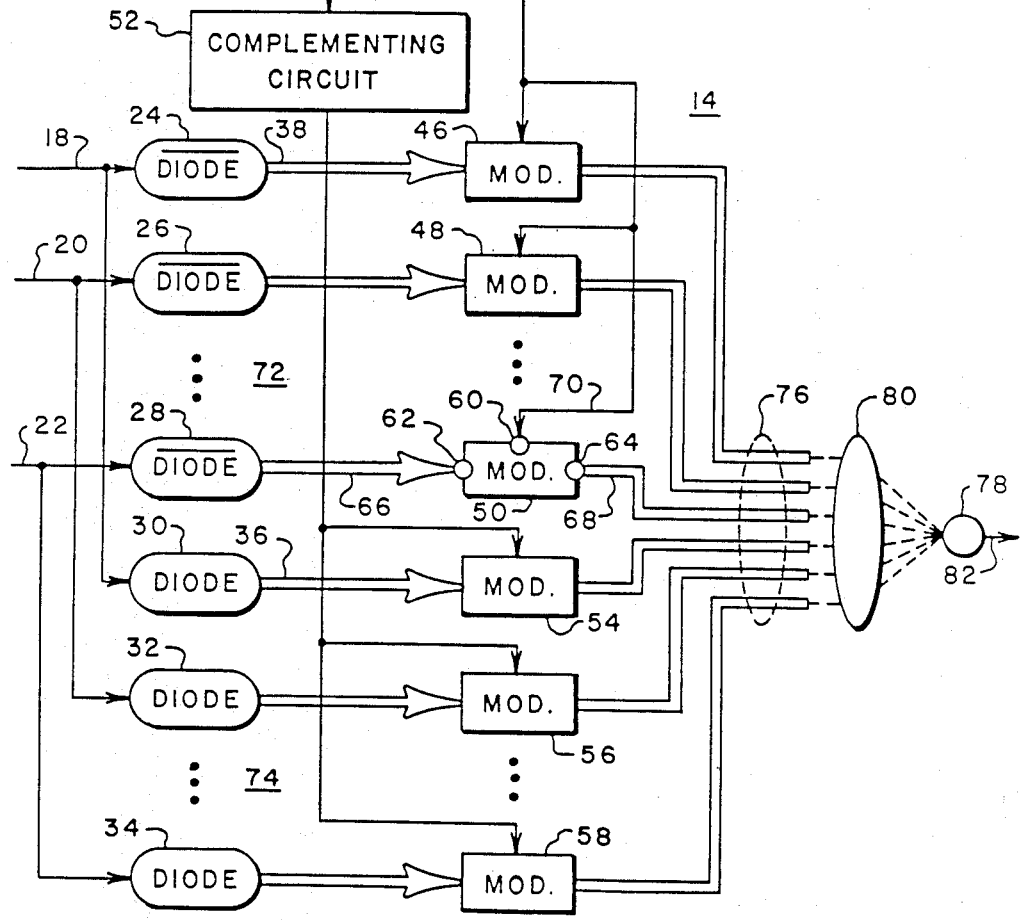
FIG. 1 is a block diagram illustrating the general layout of components needed to test high-speed logic devices.
FIG. 5 is a diagram of a parallel, high-speed optical testing system constructed according to one embodiment of this invention.

Throughout the following description, similar reference characters refer to similar elements or members in all of the figures of the drawings.

Referring now to the drawings, and to FIG. 1 in particular, there is shown a block diagram of a logic device testing system. The overall system includes the vector generator 10 which generates the input conditions, or logic signals, which are applied to the device under test 12. In many cases, a single vector may consist of a parallel transfer of bit information to the device under test, such as a 32-bit word. A vector would normally be generated for each of the possible input conditions which, for a 32-bit vector, would be equal to 2 to the 32nd power.

The device under test 12 may be an isolated integrated circuit chip, or a complete board containing several integrated circuits. The main requirement for the device to be tested with this type of testing system is that it has a known output condition which will be produced when the device operates correctly with a known input condition. As would normally be the case, a plurality of output lines or terminal connections 13 contain the multi-bit output signal and are applied to the testing system 14. The testing system 14 looks at the bit patterns existing on the lines 13 and determines whether they are the correct outputs for the vectors applied to the device under test 12. If they are not, the error indicator 16 is signaled to flag the error condition. Although the testing system 14, in some applications, may be required to indicate not only the presence of an error but also the location and the type of the error, the testing system disclosed herein is intended for a specific application and functions at high-speed by simply detecting when an error occurs.

FIG. 2 is a table which indicates the type of errors which can exist from a digital logic device which has only two possible output states per bit position. According to condition (A), when the desired output bit is zero, or a logic low, and the actual output bit is zero, or a logic low, there is not any error in the output. According to condition (B), when the desired output is high and the actual output is low, one of the possible error types is present, therefore an error is indicated. According to condition (C), the other error condition is indicated when the desired output should be low and the actual output is high. The fourth condition, condition (D), occurs when both the desired and actual outputs are at a high logic level, and, of course, in this condition there is no error indicated.

The testing system of this invention makes use of a multiplicative approach to the testing of the logic signals from the device under test to determine if any of the error conditions shown in FIG. 2 are present. In order to produce accurate results with the multiplicative technique used by this invention, two products must be formed by the system components to ultimately yield accurate indications of a possible error. FIGS. 3 and 4 indicate the logical operations which occur in the testing system, and are useful in explaining the operation of the invention.

FIG. 3 is a table representing the first product which is produced by the testing system, which will be described in more detail later. According to condition (A) in FIG. 3, the desired channel output for the known input vector is a logic zero which is complemented to a high logic level for processing. This is multiplied, or ANDed, with the low actual value to produce a low product value. The product value is low which indicates, as will be further explained, that for input condition (A), the output is accurate and not in error. For input condition (B), a low logic value represents the complement of the desired output bit, and a low represents the actual output of the device under test. This produces a product having a low logic value which also indicates a result which is not in error. According to condition (C), a high value for the complemented logic level of the desired output and the high value of the actual output produces a high product level, which does indicate an error result since the uncomplemented desired value was different than the actual value.

Since the products produced by the multiplicative process of this invention are optical signals, as will be discussed, a light signal is produced only when a high logic level is indicated for the product in FIG. 3. Thus, it is an easy task to detect when the result represents an error condition by observing, either manually by the operator or automatically by electrically detecting the presence of light, when an error condition exists. The fourth condition, condition (D), occurs when the complement of the desired output is low, the actual output is high, and the product produced by these two logic states is a logic low, thereby indicating that no error is present.

While one type of error is detected by forming the products shown in FIG. 3, it should be observed that the error which exists at condition (B) of FIG. 2 did not appear in the result. Therefore, the products formed according to FIG. 3 are not totally conclusive as to the presence of any errors in the outputs of the device being tested. Consequently, further testing must be accomplished to obtain the true results.

FIG. 4 is a table which illustrates a second set of products which the system of this invention uses to test the outputs of the device. The multiplicative process indicated in FIG. 4 uses the desired output and the complement of the actual output. These values are used to produce products which indicate, when a product is high, that an error is present for the particular condition tested. For conditions (A) and (D) of FIG. 4, no error is indicated since the products are low. For condition (B), which occurs when the desired output is high and the complement of the actual output is high, an error is indicated because the product is at a high logic level. For condition (C), an error is not indicated since the product is at a low logic level, even though the desired and actual output levels are in error. Therefore, it is necessary to combine the results of FIGS. 3 and 4, that is, the products formed by the system of this invention, to accurately determine whether an error exists at the outputs of the device being tested. The products shown in FIG. 3 indicate an error at condition (C), and not at condition (B), whereas the products indicated in FIG. 4 uncover the error at condition (B) and not at condition (C). In order to combine the products quickly, accurately and easily, the invention uses optical logic to represesnt some of the values depicted in FIGS. 3 and 4.

Throughout this description, reference is made to products being formed according to the logic of FIGS. 3 and 4. For clarity, the individual channel products for each output bit which are formed by the same multiplicative logic process may collectively be referred to as a single product. For example, the products formed for each channel according to the logic of FIG. 3 may be referred to as one product and the products formed according to the logic of FIG. 4 may be referred to as another product.

FIG. 5 is a diagram of a parallel embodiment of the invention which can quickly perform the products necessary to test the outputs of the device being tested for error conditions. According to FIG. 5, the actual outputs from the device under test 12 are processed into optical logic signals which interact with electrical logic signals produced by the reference, or desired, values for the device being tested.

As shown in FIG. 5, the output bits, terminals, or channels from the device under test are connected to the lines 18, 20 and 22, and to any intermediate lines which would be necessary to equal the number of channels being tested. These lines contain information which corresponds to the actual outputs of the device under test. The actual output signals, or bits, are converted into logical optical signals by the diodes 24, 26, 28, 30, 32 and 34. These diodes may be laser diodes which give an output of light to the light fibers attached thereto when the appropriate electrical logic level is applied to the diodes. Diodes 30, 32 and 34 produce a high logic in the optical system when the electrical logic is high. For example, when the electrical logic signal on line 18 is high, light is produced by diode 30 and transferred to the light fiber 36. On the other hand, when the electrical logic signal on line 18 is low, no light is produced by diode 30 for application to the light fiber 36. Diodes 24, 26 and 28 are complementing diodes which compliment the electrical signals to produce optical logic which is the complement of the electrical logic. For example, when the electrical logic on line 18 is high, the diode 24 does not produce light for application to the light fiber 38. For the other condition when the electrical logic on line 18 is low, the inverting, or complementing diode 24 produces light which is applied to the light fiber 38. Although referred to as complementing laser diodes, it is to be understood that those skilled the art could construct a simple circuit using standard laser diodes which would effectively complement the logic state of the electrical input signals.

A reference generator 40 provides the values, or signal, which represent the correct values desired from the device under test when applied with the known input vectors. The reference generator 40 may be a chip or board similar to the one being tested, but known to produce all of the correct outputs. The reference generator 40 may also be provided by obtaining values stored in a digital memory device. Synchronization of the reference generator 40 with a vector generator is provided by the controller 42, which can be a microprocessor system. Arrow 44 indicates the connection to the vector generator which is not applied to the modulators 46, 48 and 50. These electrical signals applied to the modulators from the reference generator 40 change the light passing ability of the modulators, depending upon the logic level of the electrical signals. A complementing circuit 52 complements the signal from the reference generator 40 and applies a complemented reference signal to the modulators 54, 56 and 58.

The modulators 46, 48, 50, 54, 56 and 58 are light intensity modulators which control the passage of light from the input fiber to the output fiber connected thereto, depending upon the level of voltage applied to its control connection. For example, the modulator 50, as well as the other modulators, includes the electrical control terminal or connection 60, the optical input connection 62, and the optical output connection 64. When light enters the modulator 50 from light fiber 66, it will pass through the modulator to light fiber 68 when the potential coming from electrical line 70 is of the proper value. An optical guided-wave device, known as a Mach-Zehnder modulator, is available commercially for the high-speed intensity modulation of light required by this testing system. These modulators use a lithium niobate crystal having two waveguides, one of which is influenced by the electric field from an electrode driven by the electrical control connection. When a suitable voltage exists on the electrical connection, the light in one of the waveguides is shifted in phase by 180 degrees and caused to interfere destructively at the output of the modulator, thereby cancelling the light output. A current source of such modulators is Crystal Technology, Palo Alto, Calif.

Although not shown in FIG. 5, suitable voltage changing circuitry may be needed to make the logic levels from the reference generator 40 compatible with the voltage requirements of the control connection on the modulators. In addition, and depending upon the level of the voltage needed to block the passage of light, inverting, or complementing circuitry may be needed at each modulator to put the correct logic level on the control terminals. Normally, such light intensity modulators, standing alone, effectively complement the input electrical logic signal since they pass light only when the signal is at a logic zero. Nevertheless, the modulators shown in FIG. 5 illustrate the function of the modulators in the testing system when the modulators are appropriately constructed and configured to control the passage of light from the electrical logic signals. The modulators in FIG. 5 are so constructed and configured that they stop the passage of light when the input electrical connection is at a low logic level.

The testing system of FIG. 5 is divided into two parallel operating sections, section 72 and section 74. Section 72 includes the diodes 24, 26 and 28, and the modulators 46, 48 and 50. This section performs the product indicated by FIG. 4. Section 74 of the parallel operating testing system includes the diodes 30, 32 and 34, and the modulators 54, 56 and 58. Section 74 performs the product illustrated by FIG. 3. Since a high output from either product or parallel operating section will indicate an error, and since the outputs are optical signals, they can be combined conveniently by bundling the light fibers together, as shown by fiber bundle 76. These can be observed or detected by a light detecting diode 78, either directly or by additional focusing by the lens 80. Once the light signal is detected, it is converted into electrical signals and transferred across line 82 to any further electrical detecting equipment.

By producing two optical products, each containing the number of bits tested in the device under test, and by observing when any light exists in either of the optical products, any error condition in the device under test can be quickly detected. One of the products uses the optical equivalent of the actual output signal and the electrical complement of the desired reference signal to produce the channel products. The other product uses the optical complement of the actual output signals together with the electrical equivalent of the uncomplemented reference signal to produce the channel products. The two logic products are combined to eliminate the ambiguity which exists by using only one of the products to test for any errors in the device.

Figure 6:
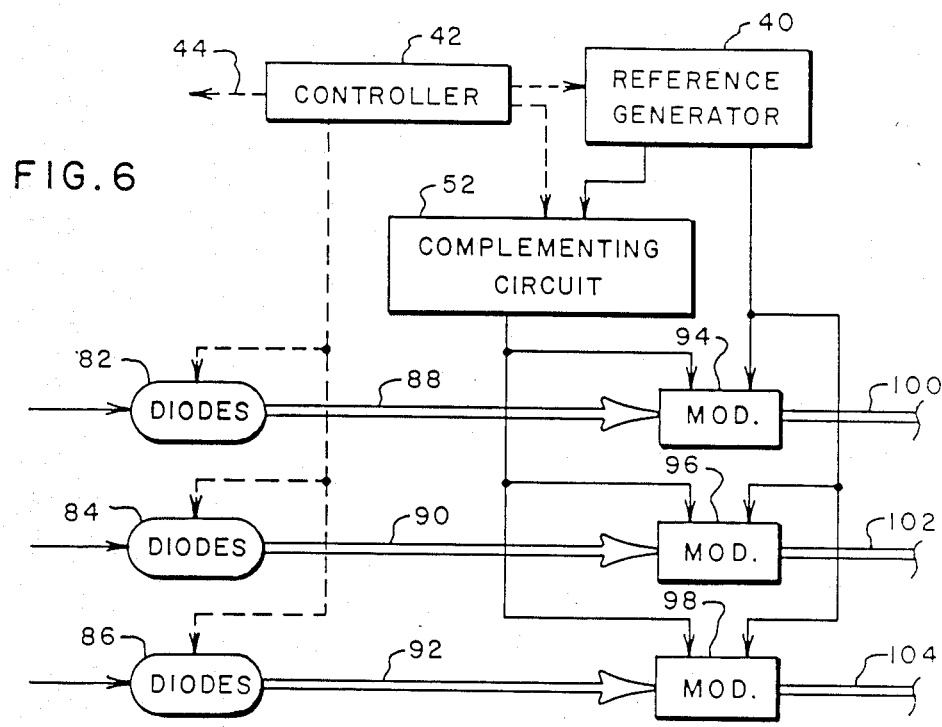
FIG. 6 is a partial diagram of a sequential, high-speed optical testing system constructed according to another embodiment of this invention.

Instead of performing the products in a parallel fashion simultaneously as indicated in FIG. 5, they may be performed sequentially, or at differenet time intervals, as shown by the embodiment in FIG. 6. According to FIG. 6, which is a partial modification to the circuit shown in FIG. 5, the diodes 82, 84 and 86 are connected to the outputs of the device under test. These laser diodes convert the electrical signals from the output under test into optical light signals which are transmitted across the light fibers 88, 90 and 92 to the light modulators 94, 96 and 98, respectively. During one portion or interval of time, the controller 42 causes the laser diodes to operate in the non-inverting or non-complementing mode. During the same interval of time, the complementing circuit 52 is activated so that the reference signals applied to the modulators 94, 96 and 98 are complemented. Thus, with these conditions, the circuit portion shown in FIG. 6 produces the product illustrated by FIG. 3.

At a different time interval, the controller causes the laser diodes 82, 84 and 86 to act as complementing or inverting diodes and also causes the complementing circuit 52 to be effectively removed from the circuit. Thus, the actual electrical output signals from the device being tested are converted and complemented into optical signals which are controlled by the uncomplemented electrical logic levels from the reference generator 40, thereby producing the logic product illustrated in FIG. 4. Although the two products can be formed sequentially one right after the other, it is not necessary that such a sequence be used. It is only necessary that, at some time during the testing of the device, both products be formed to check for the fault conditions each product detects. The light fibers 100, 102 and 104, shown in FIG. 6, are bundled together and focused onto a detecting diode, similar to the embodiment shown in FIG. 5.

The embodiments of FIG. 5 and FIG. 6 use laser diodes to convert electrical signals from the device under test into optical light signals for use by the light modulators. Without the signals being converted to light signals, the multiplicative action of the modulators, and the compressive or combining capabilities of optical signals could not be realized. It is emphasized, however, that the signals, or logic levels, from the device being tested may already exist as optical signals instead of electrical signals. These optical signals could be applied directly to the modulators without the need for the laser diodes as shown in these embodiments. When devices are being tested which have optical outputs, provision would have to be made to complement the optical outputs if it is not already provided on the board or device being tested.

Figure 7:
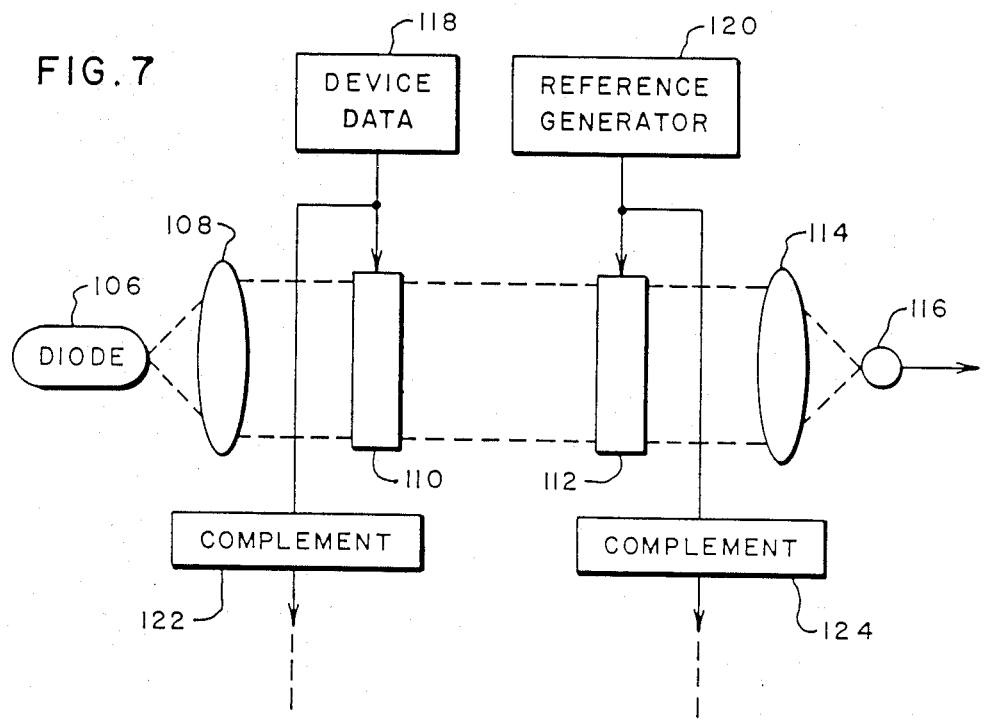
FIG. 7 is a diagram of an acousto-optic testing system constructed according to still another embodiment of this invention.

FIG. 7 is a diagram illustrating another embodiment of the invention which may be used to produce the products needed for accurate testing of the device. In this embodiment, the light from a laser diode 106 is collimated, by the lens 108, through the modulators 110 and 112, to the lens 114 and the detecting diode 116. The modulators 110 and 112 may be acousto-optic (AO) modulators, or cells, which are loaded with the electrical logic signals from the device being tested, as represented by block 118, and by the reference data from the reference generator 120. During one portion of the test, the device data is entred in the uncomplemented state, and the reference data is entered in the complemented state. This produces the product indicated in FIG. 3. At a different time interval, the device data would be complemented and the reference data would not be complemented, thereby providing the product illustrated in FIG. 4. Only when the logic levels are both high in the two modulators will light pass from the diode 106 to the detector 116. Such a passage of light will occur only for condition (C) in FIG. 3 and for condition (B) in FIG. 4, which are the two error conditions. Thus, an error is indicated when, and only when, light is detected by diode 116.

A parallel embodiment of the acousto-optic implementation shown in FIG. 7 would include a second set of modulators, lenses, laser diodes and detector. As shown by the complement circuits 122 and 124, which would be used in this parallel embodiment, the device data would be complemented before being applied to one of the AO cells in the second portion of the parallel system (not shown), and the complemented reference data would be again complemented back to its original state and applied to the other AO cell. Of course, the complement circuit 124 could instead be moved to the path leading to AO cell 112 if uncomplemented (or non-complemented) refernece data was provided by generator 120. Instead of using a physically separate channel to form the other product, two dimensional AO cells may be used in the system shown in FIG. 7, wherein one channel is used to form one product and the other channel is used to form the remaining product. Both products would be focused simultaneously upon the diode 116 to provide the indication of any errors in the outputs of the device being tested.

The testing system disclosed by the embodiments of this invention uniquely use the compressive abilities of light signals to combine multiple outputs for detection by a single source with a multiplicative algorithm for combining electrical and optical signals. This provides reliable information on the content of errors in the output channels of the device being tested. It is emphasized that numerous changes may be made in the above described system without departing from the teachings of the invention. It is intended that all of the matter contained in the forgoing description, or shown in the accompanying drawings, shall be interpreted as illustrative rather than limiting.

I claim as my invention:

1. An optical system for testing high-speed logic devices producing high and low logic level signals at a plurality of output terminals, said system comprising:
   first means for producing a first plurality of optical signals corresponding to products of actual output logic signals from a logic device and complements of desired logic signals, said plurality of optical signals including light only when said actual output logic signals and said complements of said desired logic signals are both at high logic levels;
   second means for producing a second plurality of optical signals corresponding to products of complements of said actual output logic signals from said logic device and said desired logic signals, said second plurality of optical signals including light only when said complements of said actual output logic signals and said desired logic signals are both at logic high levels;
   means for detecting when light is included in either of said first or second plurality of optical signals, wherein detection of light indicates the occurrence of a logic error in one or more of said actual output logic signals.

2. The optical testing system of claim 1 wherein said first means for producing said first plurality of optical signals and said second means for producing said second plurality of optical signals each includes a plurality of light modulators, each of said light modulators having an input optical connection, an output optical connection and an electrical control connection, wherein an electrical potential applied to the control connection determines whether light passes from the input optical connection to the output optical connection.

3. The optical testing system of claim 2 wherein each of said light modulators is an optical guided-wave, Mach-Zehnder modulator.

4. The optical testing system of claim 2 further comprising bundled optical fibers each of said fibers being connected to one of said output optical connections.

5. The optical testing system of claim 4 including a lens for collinating light from the bundle optical filers onto a single light detector.

6. The optical testing system of claim 2 wherein the input optical connections of each light modulator are connected to receive light signals corresponding to one of said actual output logic signals of said logic device.

7. The optical testing system of claim 6 further comprising laser diodes for converting said actual output logic signals from said logic device to logic representative light signals for connection to the input optical connections of the light modulators.

8. The optical testing system of claim 6 wherein the light signals connected to the input optical connections of the light modulators are derived from optical outputs of the logic device being tested.

9. The optical testing system of claim 2 wherein the desired logic signals are applied, as electrical signals, to the control connections of the light modulators.

10. The optical testing system of claim 2 wherein the compliments of the desired logic signals are applied, as electrical signals, to the control connnections of the light modulators.

11. The optical testing system of claim 2 wherein two of said light modulators receive each output logic signal from the logic device, with the desired logic signal being applied to the control connection of one of the two modulators and with the complement of the desired logic signal being simultaneously applied to the control connection of the other one of the two modulators.

12. The optical testing system of claim 2 wherein a single one of the light modulators receives each actual output logic signal from the logic device, with the desired logic signal being applied to the control connection on said modulator during one time interval, and with the complement of the desired logic signal being applied to the same control connection during another time interval.

13. The optical testing system of claim 1 wherein the first means for producing said first plurality of optical signals and the second means for producing said second plurality of optical signals each includes an acousto-optic modulator located serially between a light source and the light detecting means.

14. The optical testing system of claim 13 wherein an electrical signal representative of the uncomplemented actual output logic signals is applied during a first time interval to one of said modulators, and wherein an electrical signal representative of the complement of the desired logic signals is applied during said first time interval to a second one of a said modulators.

15. The optical testing system of claim 13 wherein an electrical signal representative of the complement of the actual output logic signals is applied during a first time interval to a first one of said modulators, and wherein an electrical signal representative of the uncomplemented desired logic signals is applied during said first time interval to a second one of said modulators.

16. An optical system for testing high-speed logic devices producing high and low logic level signals at a plurality of output terminals, said system comprising:
   a plurality of light modulators each having input and output optical connections and an electrical control connection;
   means for applying an electrical signal to the control connection of each of the modulators which is dependent upon desired logic signals, with the electrical signals applied to each control connection determining whether each light modulator passes light from the input connection to the output connection;
   means for applying an optical signal to the input connection of each of said modulators, with said optical signal being actual output logic signals from a logic device;
   means for combining the optical light passed by the light modulators; and
   means for detecting when light is passed by any of the light modulators.

17. The optical testing system of claim 16 wherein two of said light modulators are associated with each output terminal of the logic device;
   with a first one of said two modulators having the optical signal applied to its input connection representing the complemented state of the actual output logic signals, and with the electrical signal applied to the control connection of said first modulator representing the uncomplemented state of the desired logic signal; and
   with a second one of said two modulators having the optical signal applied to its input connection representing the uncomplemented state of the actual output logic signals, and with the electrical signal applied to the control connection of said second modulator representing the complemented state of the desired logic signal.

18. The optical testing system of claim 16 wherein, for each light modulator:
   the electrical signal applied to the control connection of the light modulator represents a complement of the desired logic signals, during a first time interval;
   the optical signal applied to the input connection of the light modulator represents an uncomplemented actual output logic signal during said first time interval;
   the electrical signal applied to the control connection of the light modulator represents an uncomplemented desired logic signal during a second time interval; and
   the optical signal applied to the input connection of the light modulator represents a complemented actual output logic signal during said second time interval.

19. A method of testing high-speed logic deviced producing high and low logic level signals at a plurality of output terminals, said method including the steps of:
   producing a first plurality of optical signals corresponding to products of actual output logic signals from a logic device and complements of desired logic signals, said plurality of optical signals including light only when said actual output logic signals and said complements of said desired logic signals are both at high logic levels;

producing a second plurality of optical signals corresponding to products of complements of said actual output logic signals from said logic device and said desired logic signals, said second plurality of optical signals including light only when said complements of said actual output logic signals and said desired logic signals are both at logic high levels;

detecting when light is present in either of said first or second plurality of optical signals.

20. The testing method of claim 19 wherein the first and second plurality of optical signals are produced simultaneously in time.

21. The testing method of claim 19 wherein the first and second plurality of optical signals are produced during different time intervals.

22. The testing method of claim 19 including the step of applying, to a plurality of light modulators:
   optical signals which represent uncomplemented actual output logic signals from said logic device; and
   electrical signals which represent a complement of the desired logic signals.

23. The testing method of claim 19 including the step of applying, to each of said light modulators:
   optical signals which represent a complemented actual output logic signal from said logic device; and
   elecrtrical signals which represent uncomplemented desired logic signals.

* * * * *